(12) United States Patent  
Nishimine et al.

(10) Patent No.: US 7,409,615 B2  
(45) Date of Patent: Aug. 5, 2008

(54) TEST APPARATUS AND TEST METHOD

(75) Inventors: Hiroaki Nishimine, Tokyo (JP); Hirokatsu Niijima, Tokyo (JP); Takeo Miura, Tokyo (JP)

(73) Assignee: Advantest Corporation, Tokyo (JP)

( * ) Notice: Subject to any disclaimer, the term of this patent is extended or adjusted under 35 U.S.C. 154(b) by 77 days.

(21) Appl. No.: 11/495,186

(22) Filed: Jul. 28, 2006

(65) Prior Publication Data

US 2007/0022346 A1    Jan. 25, 2007

Related U.S. Application Data

(63) Continuation of application No. PCT/JP2005/000993, filed on Jan. 26, 2005.

(30) Foreign Application Priority Data

Jan. 29, 2004    (JP) ............................ 2004-021851

(51) Int. Cl.
*G01R 31/28* (2006.01)
*G06F 11/00* (2006.01)

(52) U.S. Cl. ..................................... 714/734; 714/736

(58) Field of Classification Search ................ 714/734, 714/733, 735, 736, 819; 327/763; 324/765; 702/117

See application file for complete search history.

(56) References Cited

U.S. PATENT DOCUMENTS

| | | | | |
|---|---|---|---|---|
| 6,445,208 B1 * | 9/2002 | Sugamori | ................... | 324/771 |
| 6,859,059 B2 * | 2/2005 | Rohrbaugh et al. | ......... | 324/763 |
| 7,023,233 B1 * | 4/2006 | Furukawa | ................... | 324/769 |
| 7,298,162 B2 * | 11/2007 | Furukawa | ................... | 324/769 |
| 2006/0071682 A1 * | 4/2006 | Hashimoto | ................... | 324/771 |

FOREIGN PATENT DOCUMENTS

| | | |
|---|---|---|
| JP | 2002-139551 | 5/2002 |
| JP | 2003-279629 | 10/2003 |

OTHER PUBLICATIONS

International Search Report issued in International application No. PCT/JP2005/000993 mailed on May 27, 2005, 2 pages.

* cited by examiner

*Primary Examiner*—Phung M Chung  
(74) *Attorney, Agent, or Firm*—Osha Liang LLP

(57) ABSTRACT

A test apparatus for testing a device under test 15 is provided. The test apparatus includes a driver 122 for applying a test signal to the device under test, a comparator 128 for comparing a result signal outputted by the device under test 15 corresponding to the applied test signal with a predetermined reference voltage and a setting voltage output section 110 for setting the voltage of the test signal to a predetermined voltage value to cause the driver 122 to terminate the transmission path of the result signal when the test apparatus reads from the device under test 15.

6 Claims, 6 Drawing Sheets

TEST APPARATUS AND TEST METHOD

CROSS REFERENCE TO RELATED APPLICATION

The present application claims priority from a Japanese Patent Application(s) No. 2004-021851 filed on Jan. 29, 2004, the contents of which are incorporated herein by reference.

BACKGROUND OF THE INVENTION

1. Field of the Invention

The present invention relates to a test apparatus and a test method for testing a device under test by switching between a writing and a reading to/from the device under test.

2. Related Art

Conventionally, when a semiconductor device is tested, pass/fail of the semiconductor device is determined by measuring an output signal of the semiconductor device. For example, pass/fail of the semiconductor device is determined by comparing the output signal with a predetermined pattern. In such a test apparatus, a part of a transmission path for a test signal to be written to the semiconductor device and a part of a transmission path for an output signal to be read from the semiconductor device are shared with each other. Therefore, when the output signal is read from the semiconductor device, it is necessary to stop providing a test signal to a driver for writing the test signal to the semiconductor device. Conventionally, in such a test apparatus, it is switched by using a relay whether the test signal is provided to the driver.

Any existence of prior art documents is not found at this time, so that the description regarding prior art documents is omitted.

However, when it is switched by using a relay whether the test signal is provided to the driver, a time for switching is varied by the difference of accuracy of components of the relay. Therefore, it has been difficult to accurately control a timing at which the test signal is written to the semiconductor device. Additionally, it has been difficult to accurately test due to switching noise of the relay.

SUMMARY OF THE INVENTION

Thus, an object of the present invention is to provide a test apparatus and a test method being capable of solving the problem accompanying the conventional art. This object is achieved by combining the features recited in independent claims. Then, dependent claims define further effective specific example of the present invention.

In order to solve the above-described problem, a first aspect of the present invention provides a test apparatus for testing a device under test. The test apparatus includes: a driver for applying a test signal to the device under test; a comparator for comparing a result signal outputted by the device under test corresponding to the applied test signal with a predetermined reference voltage; and a setting voltage output section for setting the voltage of the test signal to a predetermined voltage value to cause the driver to terminate a transmission path of the result signal. The test signal may be a digital signal. The test apparatus may further include a voltage setting section for switchably setting the predetermined setting voltage in the setting voltage output section to logic H or logic L.

The test apparatus may further include: a first relay for switching whether a test signal is provided to the driver; a terminating circuit for terminating a transmission path of the result signal; a second relay for switching whether the transmission path of the result signal is terminated by the terminating circuit; and a relay control section for switchably controlling whether the first driver stops providing the test signal to the driver and the second relay causes the terminating circuit to terminate the transmission path of the result signal instead that the setting voltage output section causes the driver to terminate the transmission path of the result signal when the test apparatus reads from the device under test.

The test signal may be a digital signal. The test apparatus may further include an operation control section for generating an operation control signal which is logic H during writing to the device under test and which is logic L during reading from the device under test. The setting voltage output section may include an AND circuit for performing AND operation of the test signal and the operation control signal and outputting the result of the operation to the driver to set the voltage value of the test signal to logic L and cause the driver to terminate the transmission path of the result signal.

The test apparatus may further include an operation control section for generating an operation control signal which is logic H during writing to the device under test and which is logic L during reading from the device under test. The voltage setting section may include: a voltage setting control section for generating a voltage setting control signal indicative of a predetermined setting voltage in the setting voltage output section; a first AND circuit for performing AND operation of the inverted value of the operation control signal and the inverted value of the voltage setting control signal and outputting the inverted value of the result of the operation; and a second AND circuit for performing AND operation of the inverted value of the operation control signal and the voltage setting control signal. The setting voltage output section may include a third AND circuit for performing AND operation of the test signal and the inverted value of the result of the operation outputted by the first AND circuit, and an OR circuit for performing OR operation of the result of the operation by the third AND circuit and the result of the operation by the second AND circuit and outputting the result of the operation to set the voltage value of the test signal to the value of the voltage setting control signal and cause the driver to terminate the transmission path of the result signal when the test apparatus reads from the device under test.

The test signal may be a digital signal. The test apparatus may further include an operation control section for generating an operation control signal which is logic H during writing to the device under test and which is logic L during reading from the device under test. The relay control section may include a relay control signal generating section for generating, during writing to the device under test, a relay control signal which is logic H when the setting voltage output section causes the driver to terminate the transmission path of the result signal and which is logic L when the first relay stops providing the test signal to the driver and the second relay causes the terminating circuit to terminate the transmission path of the result signal, a first AND circuit for performing AND operation of the inverted value of the operation control signal and the relay control signal and outputting the inverted value of the result of the operation and a second AND operation circuit for performing AND operation of the inverted value of the operation control signal and the inverted value of the relay control signal, outputting the inverted value of the result of the operation as an actuating signal of the first relay and also outputting the result of the operation as an actuating signal of the second relay to stop providing the test signal to the driver and cause the terminating circuit to terminate the transmission path of the result signal when the test apparatus reads from the device under test and the relay control signal is logic L. The setting voltage output section may include a third AND circuit for performing AND operation of the test signal and the inverted value of the result of the operation outputted by the first AND circuit and outputting the result of the operation to the driver through the first relay to cause the driver to terminate the transmission path of the result signal when the test apparatus reads from the device under test and the relay control signal is logic H.

A second aspect of the present invention provides a test method for testing a device under test in a test apparatus including a driver for applying a test signal to the device under test, and a comparator for comparing the result signal outputted by the device under test corresponding to the applied test signal with a predetermined reference voltage. The test method includes a step of setting the voltage of the test signal to a predetermined voltage value to cause the driver to terminate a transmission path for the test signal.

Here, all necessary features of the present invention are not listed in the summary of the invention. The sub-combinations of the features may become the invention.

According to the present invention, a timing at which a test signal is written to the device under test can be accurately controlled.

DETAILED DESCRIPTION OF THE INVENTION

Hereinafter, the present invention will be described through preferred embodiments. The embodiments do not limit the invention according to claims and all combinations of the features described in the embodiments are not necessarily essential to means for solving the problems of the invention.

Figure 1:
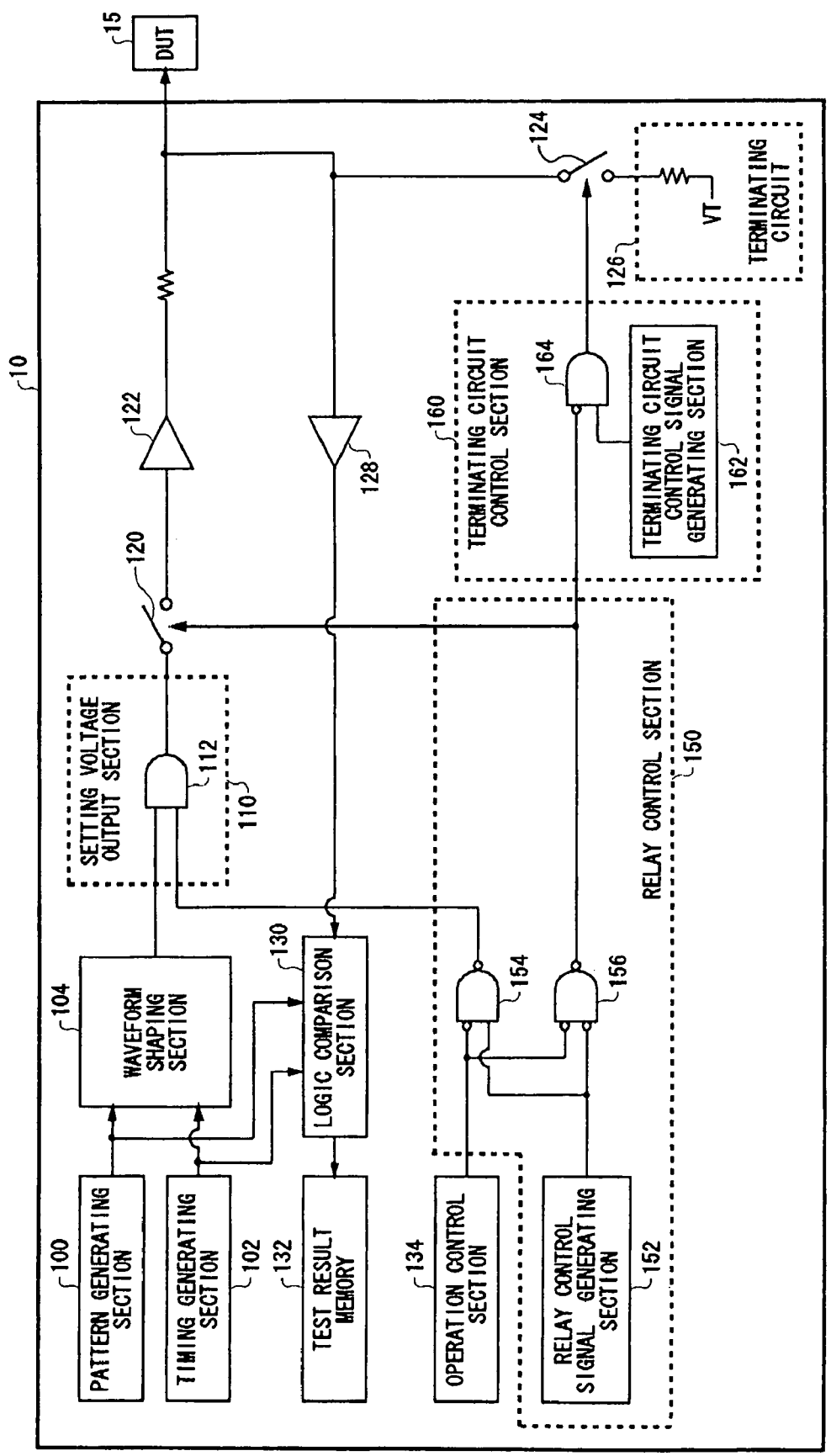
FIG. 1 is a block diagram showing an example of the configuration of a test apparatus 10 according to a first embodiment of the present invention.

FIG. 1 is a block diagram showing an example of the configuration of a test apparatus 10 according to the first embodiment of the present invention. The test apparatus 10 tests a DUT (Device Under Test) 15 by applying a test signal to the DUT 15. The test apparatus 10 includes a pattern generating section 100, a timing generating section 102, an waveform shaping section 104, a setting voltage output section 110, a first relay 120, a driver 122, a second relay 124, a terminating circuit 126, a comparator 128, a logic comparison section 130, a test result memory 132, an operation control section 134, a relay control section 150 and a terminating circuit control section 160.

The test apparatus 10 applies a test signal to the DUT 15 by using the driver 122. Then, the test apparatus 10 compares a result signal outputted by the DUT 15 corresponding to the applied test signal with a reference value and collates the comparison result with an expected value to determine pas/fail of the DUT 15. Here, a part of a transmission path for the test signal from the driver 122 to the DUT 15 and a part of a transmission path of the result signal from the DUT 15 to the comparator 128 are shared with each other. Therefore, when the comparator 128 reads the result signal from the DUT 15, it is necessary to stop providing the test signal to driver 122. Additionally, the transmission path of the result signal has to be terminated in order to read the result signal by the comparator 128.

The object of the test apparatus according to the present embodiment is to switchably set whether the relay is used or not used to control the provision of the test signal to the driver 122 and the termination of the transmission path of the result signal when the test apparatus writes to the test signal to the DUT 15 or when the test apparatus read from the result signal from the DUT 15.

The pattern generating section 100 generates a test signal being a digital signal and outputs the same to the waveform shaping section 104. Additionally, the pattern generating section 100 generates an expected value and outputs the same to the logic comparison section 130. The timing generating section 102 generates a timing signal indicative of a timing at which the test signal is written to the DUT 15 and outputs the same to the waveform shaping section 104 and the logic comparison section 130. The waveform shaping section 104 outputs the test signal received from the pattern generating section 100 to the setting voltage output section 110 at the timing indicated by the timing signal received from the timing generating section 102.

The setting voltage output section 110 outputs the test signal received from the waveform shaping section 104 to the driver 122 through the first relay 120. Additionally, the setting voltage output section 110 set the voltage of the test signal outputted to the driver 122 to a predetermined voltage value to cause the driver to terminate the transmission path of the result signal during reading from the DUT 15 in the case that the provision of the test signal to the driver 122 and the termination of the transmission path of the result signal are controlled without any relay. In this case, the test apparatus 10 tests the DUT 15 being capable of terminating the transmission path of the result signal based on the voltage value of the test signal. The first relay 120 switches whether the setting voltage output section 10 provides the test signal to the driver 122. The driver 122 applies the test signal received from the setting voltage output section 110 through the first relay to the DUT 15 through such as a resistance of 50 ohm.

The second relay 124 switches whether the transmission path of the result signal is terminated by the terminating circuit 126. The terminating circuit 126 terminates the transmission path of the result signal by using a termination voltage VT when the provision of the test signal to the driver 122 and the termination of the transmission path of the result signal are controlled by using the relay. The comparator 128 compares the result signal outputted by the DUT 15 with a predetermined reference voltage and outputs the comparison result to the logic comparison section 130. The logic comparison section 130 determines pass/fail of the DUT 15 based on the comparison result received from the comparator 128. Specifically, the logic comparison section 130 collates the comparison result received from the comparator 128 with the expected value received from the pattern generating section 100 at the timing indicated by the timing signal received from the timing generator 102. Then, the logic comparison section 130 determines pass/fail of the DUT 15 based on whether the comparison result is matched with the expected value. Then, the logic comparison section 130 stores the result of pass/fail of the DUT 15 in the test result memory 132.

The operation control section 134 generates an operation control signal which is logic H when the test apparatus writes to the DUT 15 and which is logic L when the test apparatus reads from the DUT 15 and outputs the same to the relay control section 150.

The relay control section 150 switchably controls whether the provision of the test signal to the driver 122 and the termination of the transmission path of the result signal are controlled without any relay. Specifically, the relay control section 150 determines which of a writing to the DUT 15 or a reading from the DUT 15 are performed by the test apparatus 10 based on the operation control signal received from the operation control section 134. Then, when the test apparatus 10 reads from the DUT 15, the relay control section 150 switchably controls whether the first relay 120 stops providing the test signal to the driver 122 and the second relay 124 causes the terminating circuit 126 to terminate the transmission path of the result signal instead that the setting voltage output section 110 causes the driver 122 to terminate the transmission path of the result signal.

The terminating control section 160 switchably controls to select either that the transmission path of the result signal is terminated by the terminating circuit 126 by short-circuiting the second relay 124 or that one end of the second relay 124 at the DUT 15 is in high-impedance by releasing the second relay 124 during reading from the DUT 15 in the case that the termination of the transmission path of the result signal is controlled by the relay.

The test apparatus 10 according to the present embodiment can switch between a writing of the test signal to the DUT 15 and a reading of the result signal from the DUT 15 without any relay. Thereby a timing at which the test signal is written to the DUT 15 can be accurately controlled. Additionally, the DUT 15 can be accurately tested without being affected by noise due to the relay. Further, the test apparatus 10 according to the present embodiment can control whether a relay is used when a writing of the test signal to the DUT 15 and a reading of the result signal from the DUT 15 are switched. Thereby the test method can be appropriately switched in response to requests from users.

Figure 2:
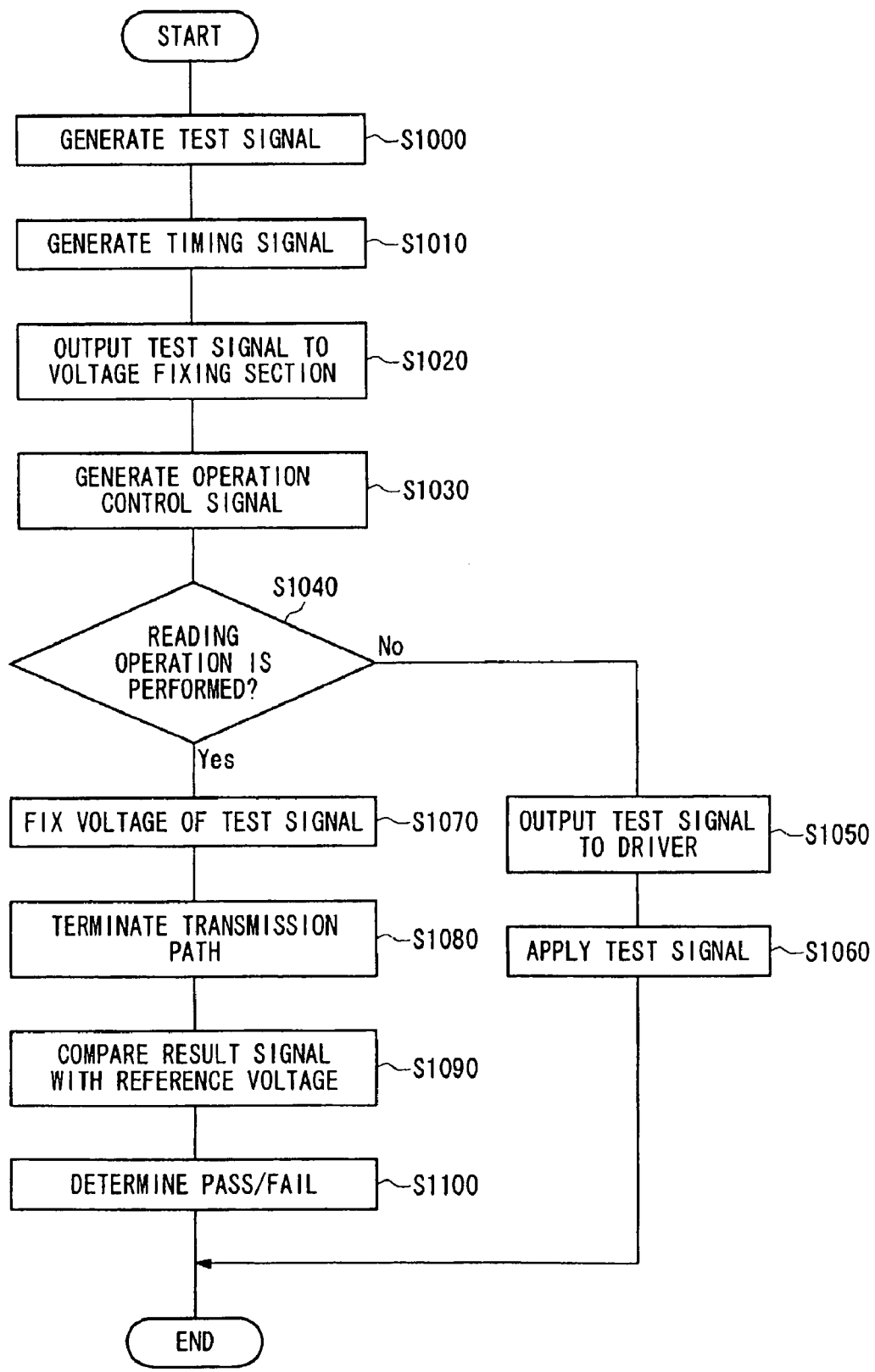
FIG. 2 is a flowchart showing an example of the operation in the test apparatus 10 according to the first embodiment of the present invention.

FIG. 2 is a flowchart showing an example of the operation in the test apparatus 10 according to the first embodiment of the present invention. In the operation of FIG. 2, the test apparatus 10 controls to provide a test signal to the driver 122 and to terminate a transmission path of the result signal without any relay.

The pattern generating section 100 firstly generates a test signal and outputs the same to the waveform shaping section 104 (S1000). Next, the timing generating section 102 generates a timing signal indicative of a timing at which the test signal is written to the DUT 15 and outputs the same to the waveform shaping section 104 (S1010). Next, the waveform shaping section 104 outputs the test signal received from the pattern generating section 100 to the setting voltage output section 110 at the timing indicated by the timing signal received from the timing generating section 102 (S1020). Next, the operation control section 134 generates an operation control signal which is logic H when the test apparatus 10 writes to the DUT 15 and which is logic L when the test apparatus 10 read from the DUT 15 and outputs the same to the setting voltage output section 110 through the relay control section 150 (S1030).

When the test apparatus 10 writes to the DUT 15 (S1040: No), the setting voltage output section 110 outputs the test signal received from the waveform shaping section 104 to the driver 122 (S1050). Then, the driver 122 applies the test signal received from the setting voltage output signal 110 to the DUT 15 (S1060). Meanwhile, when the test apparatus 10 reads from the DUT 15 (S1040: Yes), the setting voltage output section 110 sets the voltage of the test signal to a predetermined voltage value and outputs the same to the driver 122 (S1070). Then, the driver 122 outputs the test signal of which voltage is set to the predetermined voltage value to terminate the transmission path of the result signal (S1080). Next, the comparator 128 compares the result signal outputted by the DUT 15 with a predetermined reference voltage and outputs the comparison result to the logic comparison section 130 (S1090). Next, the logic comparison section 130 determines pass/fail of the DUT 15 based on the comparison result received from the comparator 128 (S1100).

As described above, the test apparatus 10 according to the present embodiment can terminate the transmission path of the result signal without any relay. Thereby the DUT 15 can be accurately tested without being affected by noise due to the relay.

FIG. 3 shows an example of waveforms of a test signal, an operation control signal, a relay control signal and a terminating circuit control signal according to the first embodiment of the present invention. Now, it will be described in detail regarding the circuitry of the relay control section 150, the setting voltage output section 110 and the terminating circuit control section 160 shown in FIG. 1.

The relay control section 150 includes a relay control signal generating section 152, a first AND circuit 154 and a second AND circuit 156. The relay control signal generating section 152, during reading from the DUT 15, generates a relay control signal which is logic H when the provision of the test signal to the driver 122 and the termination of the transmission path of the result signal are controlled without any relay, and which is logic L when the provision of the test signal to the driver 122 and the termination of the transmission path of the result signal are controlled by using the relay. Specifically, the relay control signal generating section 152, during reading from the DUT 15, generates a relay control signal which is logic H when the setting voltage output section 10 causes the driver 122 to terminate the transmission path of the result signal, and which is logic L when the first relay 120 stops providing the test signal to the driver 122 and the second relay 124 causes the terminating circuit 126 to terminate the transmission path of the result signal. Then, the relay control signal generating section 152 outputs the generated relay control signal to the first AND circuit and the second AND circuit 156.

The first AND circuit 154 performs an AND operation on the inverted value of the operation control signal generated by the operation control section 134 and the relay control signal generated by the relay control signal generating section 152 and outputs the inverted value of the result of the operation to the setting voltage output section 110. The second AND circuit 156 performs an AND operation on the inverted value of the operation control signal generated by the operation control section 134 and the inverted value of the relay control signal generated by the relay control signal generating section 152 and outputs the inverted value of the result of the operation as an actuating signal of the first relay 120. Thereby the second AND circuit 156 releases the first relay 120 to stop providing the test signal to the driver 122 when the test apparatus 10 reads from the DUT 15 and the relay control signal is logic L. Additionally, the second AND circuit 156 outputs the result of the operation to the terminating circuit control section 160.

The setting voltage output section 110 includes a third AND circuit 112. The third AND circuit 112 performs an AND operation on the test signal and the inverted value of the result of the operation outputted by the first AND circuit 154 and outputs the result of the operation to the driver 122 through the first relay 120. Thereby the third AND circuit 112 causes the driver to terminate the transmission path of the result signal when the test apparatus 10 reads from the DUT 15 and the relay control signal is logic H.

The terminating circuit control section 160 includes a terminating circuit control signal generating section 162 and a fourth AND circuit 164. The terminating circuit control signal generating section 162 generates, during reading from the DUT 15 when the termination of the transmission path of the result signal is controlled by using the relay, a terminating circuit control signal which is logic H when the terminating circuit 126 terminates the transmission path of the result signal by short-circuiting the second relay 124 and which is logic L when one end of the second relay 124 at the DUT 15 is in high-impedance by releasing the second relay 124 and outputs the signal to the fourth AND circuit 164. The fourth AND circuit 164 performs an AND operation on the result of the operation outputted by the second AND circuit 156 and the terminating circuit control signal generated by the terminating circuit control signal generating section 162 and outputs the result of the operation as an actuating signal of the second relay. Thereby the fourth AND circuit 164 short-circuits the second relay 124 and causes the terminating circuit 126 to terminate the transmission path of the result signal when the relay control signal is at logic L and the terminating circuit control signal is logic H while the test apparatus 10 reads from DUT 15.

Figure 3A:
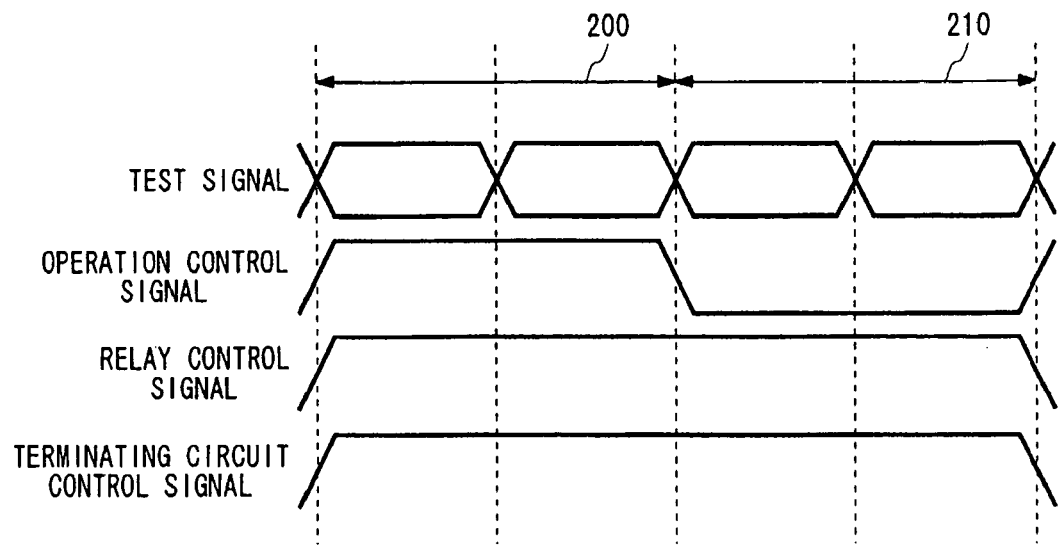
FIG. 3 shows an example of the waveforms of a test signal, an operation control signal, a relay control signal and a terminating circuit control signal.

FIG. 3A shows an example of the waveform for each of the signals when the relay control signal is logic H. Now, an operation of the test apparatus 10 in an interval 200 will be described. The operation control signal is logic H in the interval 200. That is to say, the test apparatus 10 writes to the DUT 15 in the interval 200. The first AND circuit 154 performs an AND operation on logic L being the inverted value of the operation control signal and logic H of relay control signal and outputs logic H being the inverted value of the result of the operation to the third logic circuit 112. The second AND circuit 156 performs an AND operation on logic L being the inverted value of the operation control signal and logic L being the inverted value of the relay control signal and outputs logic H being the inverted value of the result of the operation as an actuating signal of the first relay 120 to short-circuit the first relay 120. The second AND circuit 156 outputs logic H being the inverted value of the result of the operation to the fourth AND circuit. The third AND circuit 112 performs an AND operation on the test signal and logic H being the inverted value of the result of the operation outputted by the first AND circuit and outputs the test signal as the result of the operation to the driver 122 through the first relay. The fourth AND circuit 164 performs an AND operation on the inverted value of logic H being the inverted value of the result of the operation outputted by the second AND circuit 156 and logic H of the terminating circuit control signal and outputs logic L being the result of the operation as an actuating signal of the second relay 124 to release the second relay 124. Thus, the test apparatus 10 short-circuits the first relay 120 and releases the second relay to apply the test signal to the DUT 15 in the interval 124.

Next, an operation of the test apparatus 10 in an interval 210 will be described. The operation control signal is at logic L in the interval 210. That is to say, the test apparatus 10 reads from the DUT 15 in the interval 210. The first AND circuit 154 performs an AND operation on logic H being the inverted value of the operation control signal and logic H of relay control signal and outputs logic L being the inverted value of the result of the operation to the third AND circuit 112. The second AND circuit 156 performs an AND operation on logic H being the inverted value of the operation control signal and logic L being the inverted value of the relay control signal and outputs logic H being the inverted value of the result of the operation as an actuating signal of the first relay 120 to short-circuit the first relay. The second AND circuit 156 outputs logic H being the inverted value of the result of the operation to the fourth AND circuit 164. The third AND circuit 112 performs an AND operation on the test signal and logic L being the inverted value of the result of the operation outputted by the first AND circuit 154 and outputs logic L being the result of the operation to the driver 122 through the first relay 120. That is to say, the third AND circuit consistently outputs logic L to the driver 122 regardless of the value of the test signal. The fourth AND circuit 164 performs an AND operation on the inverted value of logic H being the inverted value of the result of the operation outputted by the second AND circuit 156 and logic H of the terminating circuit control signal and outputs logic L being the result of the operation as an actuating signal of the second relay 124 to release the second relay 124. Thus, the test apparatus 10 consistently outputs the signal being logic L to the driver 122 in the interval 210, short-circuits the first relay 120 and releases second relay 124 to terminate the transmission path of the result signal by using the driver 122.

Figure 3B:
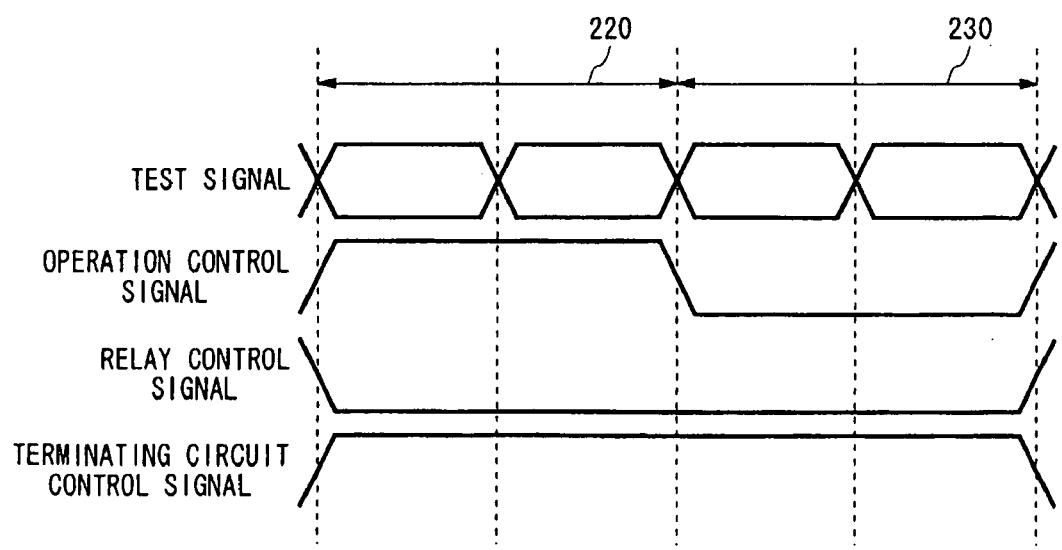

FIG. 3B shows an example of the waveform for each of the signals when the relay control signal is logic L. Firstly, an operation of the test apparatus 10 in an interval 220 will be described. The operation control signal is logic H in the interval 220. That is to say, the test apparatus 10 writes to the DUT 15 in the interval 220. The first AND circuit 154 performs an AND operation on logic L being the inverted value of the operation control signal and logic L of the relay control signal and outputs logic H being the inverted value of the result of the operation to the third AND circuit 112. The second AND circuit 156 performs an AND operation on logic L being the inverted value of the operation control signal and logic H being the inverted value of the relay control signal and outputs logic H being the inverted value of the result of the operation as an actuating signal of the first relay 120 to short-circuit the first relay 120. The second AND circuit 156 outputs logic H being the inverted value of the result of the operation to the fourth AND circuit 164. The third AND circuit 112 performs an AND operation on the test signal and logic H being the inverted value of the result of the operation outputted by the first AND circuit 154 and outputs the test signal as the result of the operation to the driver 122 through the first relay 120. The fourth AND circuit 164 performs an AND operation on the inverted value of logic H being the inverted value as the result of the operation outputted by the second AND circuit 156 and logic H of the terminating circuit control signal and outputs logic L being the result of the operation as an actuating signal of the second relay 124 to release the second relay 124. Thus, the test apparatus 10 short-circuits the first relay 120 and releases the second relay 124 in the interval 220 to apply the test signal to the DUT 15.

Next, an operation of the test apparatus 10 in an interval 230 will be described. The operation control signal is logic L in the interval 230. That is to say, the test apparatus 10 reads from the DUT 15 in the interval 230. The first AND circuit 154 performs an AND operation on logic H being the inverted value of the operation control signal and logic L of the relay control signal and outputs logic H being the inverted value of the result of the operation to the third AND circuit 112. The second AND circuit 156 performs an AND operation on logic H being the inverted value of the operation control signal and logic H being the inverted value of the relay control signal and outputs logic L being the inverted value of the result of the operation as an actuating signal of the first relay 120 to release the relay 120. Thereby the test signal is stopped being provided to the driver 122 regardless of the result of the operation in the third AND circuit. The second AND circuit 156 outputs logic L being the inverted value of the result of the operation to the fourth AND circuit 164. The fourth AND circuit 164 performs an AND operation on the inverted value of logic L being the inverted value of the result of the operation outputted by the second AND circuit 156 and logic H of the terminating circuit control signal and outputs logic H being the result of the operation as an actuating signal of the second relay 124 to short-circuit the second relay 124. Thereby the terminating circuit 126 terminates the transmission path of the result signal through the second relay. Thus, the test apparatus 10 releases the first relay 120 and short-circuits the second relay 124 to terminate the transmission path of the result signal by using the terminating circuit 126.

Here, the configuration shown in the present embodiment is nothing more than an example, so various modifications can be added to the configuration. For example, the test apparatus 10 does not necessarily have the terminating circuit control section 160. In this case, the second AND circuit 156 performs an AND operation on the inverted value of the operation control signal outputted by the operation control section 134 and the inverted value of the relay control signal generated by the relay control signal generating section 152, and then outputs the inverted value of the result of the operation as an actuating signal of the first relay 120 and also outputs the result of the operation as an actuating signal of the second relay 124. Thereby the second AND circuit 156 stops providing the test signal to the driver 122 and causes the terminating circuit 126 to terminate the transmission path of the result signal when the test apparatus 10 reads from the DUT 15 and the relay control signal is logic L.

Additionally, the test apparatus 10 does not necessarily have the first relay 120, the second relay 124, the terminating circuit 126, the relay control section 150 and the terminating circuit control section 160. In this case, the operation control section 134 generates an operation control signal and outputs the same to the third AND circuit 112. Then, the third AND circuit 112 performs an AND operation on the test signal and the operation control signal received from the operation control section 134 and outputs the result of the operation to the driver 122. Therefore, the third AND circuit 112 sets the voltage value of the test signal to logic L and causes the driver 122 to terminate the transmission path of the result signal when the test apparatus 10 reads from the DUT 15.

The test apparatus 10 according to the present embodiment 10 can switch between a writing of the test signal to the DUT 15 and a reading the result signal from the DUT 15 based on the operation control signal without any relay. Thereby a timing at which the test signal is written to the DUT 15 can be accurately controlled, and the DUT 15 can be accurately tested without being affected by noise due to the relay. Additionally, the test apparatus according to the present embodiment can control whether a relay is used to switch between a writing of the test signal to the DUT 15 and a reading of the result signal from the DUT 15. Thereby a test method according to the characteristic of the DUT 15 can be appropriately selected, so that the test can be efficiently performed.

Figure 4:
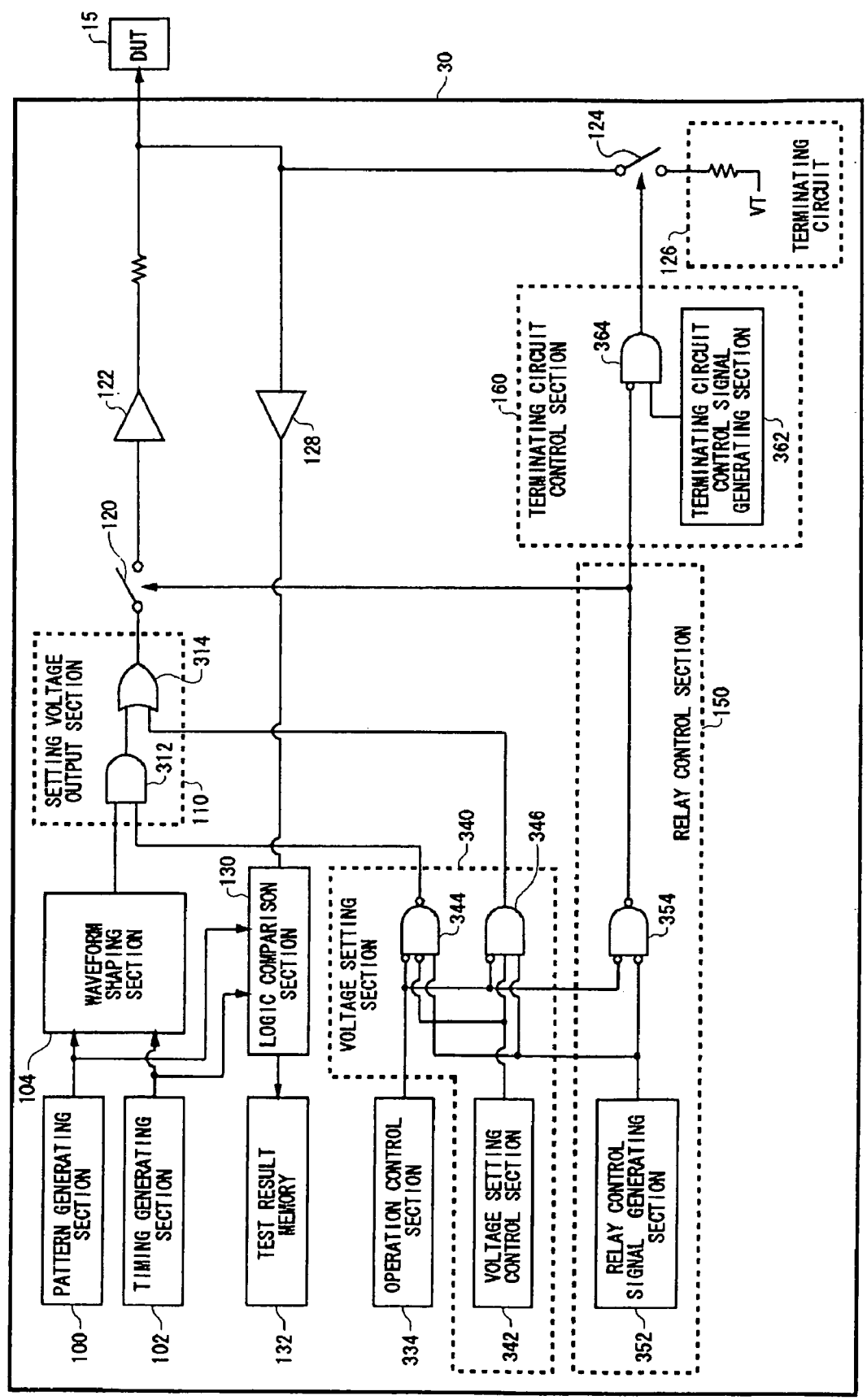
FIG. 4 is a block diagram showing an example of the configuration of a test apparatus 30 according to a second embodiment of the present invention.

FIG. 4 is a block diagram showing an example of the configuration of a test apparatus 30 according to a second embodiment of the present invention. The test apparatus 30 includes a pattern generating section 100, a timing generating section 102, an waveform shaping section 104, a setting voltage output section 110, a first relay 120, a driver 122, a second relay 124, a terminating circuit 126, a comparator 128, a logic comparison section 130, a test result memory 132, an operation control section 334, a voltage setting section 340, a relay control section 150 and a terminating circuit control section 160.

The test apparatus 10 according to the first embodiment sets the voltage of the test signal provided to the driver 122 to logic L when the transmission path of the result signal is terminated by using the driver 122. However, the test apparatus 30 according to the second embodiment switchably sets the voltage of the test signal provided to the driver 122 to logic H or logic L when the transmission path of the result signal is terminated by using the driver 122. Here, components having the reference numerals the same as those of the components shown in FIG. 1 have the functions the same as those of the components in FIG. 1, so that the description is omitted.

The operation control section 334 generates an operation control signal which is logic H when the test apparatus 30 writes to the DUT 15 and which is logic L when the test apparatus 30 reads from the DUT 15 and outputs the same to the voltage setting section 340 and the relay control section 150. The voltage setting section 340 determines which of a writing operation to the DUT 15 or a reading operation from the DUT 15 is performed by the test apparatus based on the operation control signal received from the operation control section 334. Then, the voltage setting section 340 switchably sets to logic H or logic L a predetermined setting voltage in the setting voltage output section 110, i.e. a voltage value used to terminate the transmission path of the result signal when the test apparatus 30 reads from the DUT 15.

The test apparatus according to the present embodiment can switchably set to logic H or logic L the voltage of the test signal provided to the driver 122 which terminates the transmission path of the result signal when a writing of the test signal to the DUT 15 and a reading of the result signal from the DUT 15 are switched without any relay. Thereby a test method according to the characteristic of the DUT 15 can be appropriately selected, so that the test can be efficiently performed.

FIG. 5 shows an example of the waveforms of a test signal, an operation control signal, a relay control signal, a voltage setting control signal and a terminating circuit control signal according to the present embodiment. Firstly, the circuitry of the relay control section 150, the voltage setting section 340, the setting voltage output section 110 and the relay control signal generating section 352 shown in FIG. 4 is described in detail. The relay control section 150 includes a relay control signal generating section 352 and a fourth AND circuit 354. The relay control signal generating section 352 generates, during reading from the DUT 15, a relay control signal which is logic H when the provision of the test signal to the driver 122 and the termination of the transmission path of the result signal are controlled without any relay and which is logic L when the provision of the test signal to the driver 122 and the termination of the transmission path of the result signal are controlled by using a relay. Specifically, the relay control signal generating section 352 generates, during reading from the DUT 15, a relay control signal which is logic H when the setting voltage output section 110 causes the driver 122 to terminate the transmission path of the result signal and which is L logic when the first relay 120 stops providing the test signal to the driver 122 and the second relay 124 causes the terminating circuit 126 to terminate the transmission path of the result signal. Then, the relay control signal generating section 352 outputs the generated relay control signal to the fourth AND circuit 354 and the voltage setting section 340.

The fourth AND circuit 354 performs an AND operation on the inverted value of the operation control signal generated by the operation control section 334 and the inverted value of the relay control signal generated by the relay control signal generating section 352 and outputs the inverted value of the result of the operation as an actuating signal of the first relay 120. Thereby the fourth AND circuit 354 releases the first relay 120 to stops providing the test signal to the driver 122 when the test apparatus 10 reads from the DUT 15 and the relay control signal is logic L. Additionally, the fourth AND circuit 354 outputs the result of the operation to the terminating circuit control section 160.

The voltage setting section 340 includes a voltage setting control section 342, a first AND circuit 344 and a second AND circuit 346. The voltage setting control section 342 generates a voltage setting control signal indicative of a predetermined voltage value in the setting voltage output section 110 and outputs the same to the first AND circuit 344 and the second AND circuit 346. The first AND circuit 344 performs an AND operation on the inverted value of the operation control signal generated by the operation control section 334, the inverted value of the voltage setting control signal generated by the voltage setting control section 342 and the relay control signal generated by the relay control signal generating section 352, and then, outputs the inverted value of the result of the operation to the setting voltage output section 110. The second AND circuit 346 performs an AND operation on the inverted value of the operation control signal generated by the operation control section 334, the voltage setting control signal generated by the voltage setting control section 342 and the relay control signal generated by the relay control signal generating section 352, and then, outputs the result of the operation to the setting voltage output section 110.

The setting voltage output section 110 includes a third AND circuit 312 and an OR circuit 314. The third AND circuit 312 performs an AND operation on the test signal and the inverted value of the result of the operation outputted by the first AND circuit 344 and outputs the result of the operation to the OR circuit 314. The OR circuit 314 performs an OR operation on the result of the operation of the third AND circuit 312 and the result of the operation of the second AND circuit 346 and outputs the result of the operation to the driver 122 through the first relay 120. Therefore, the OR circuit 314 sets the voltage value of the test signal to the value of the voltage setting control signal and causes the driver 122 to terminate the transmission path of the result signal.

The terminating circuit control section 160 includes a terminating circuit control signal generating section 362 and a fifth AND circuit 364. In the case that the termination of the transmission path of the result signal is controlled by using a relay, the terminating circuit control signal generating section 362 generates, during reading from the DUT 15, a terminating circuit control signal which is logic H when the terminating circuit 126 terminates the transmission path of the result signal by short-circuiting the second relay 124 and which is logic L when one end of the second relay 124 at the DUT 15 is in high impedance by releasing the second relay 124, and outputs the same to the fifth AND circuit 364. The fifth AND circuit 364 performs an AND operation on the result of the operation outputted by the fourth AND circuit 354 and the terminating circuit control signal generated by the terminating circuit control signal generating section 362 and outputs the result of the operation as an actuating signal of the second relay 124. Thereby the fifth AND circuit 364 short-circuits the second relay 124 and causes the terminating circuit 126 to terminate the transmission path of the result signal when the relay control signal is logic L and also when the terminating circuit control signal is logic H while the test apparatus 30 reads from the DUT 15.

Figure 5A:
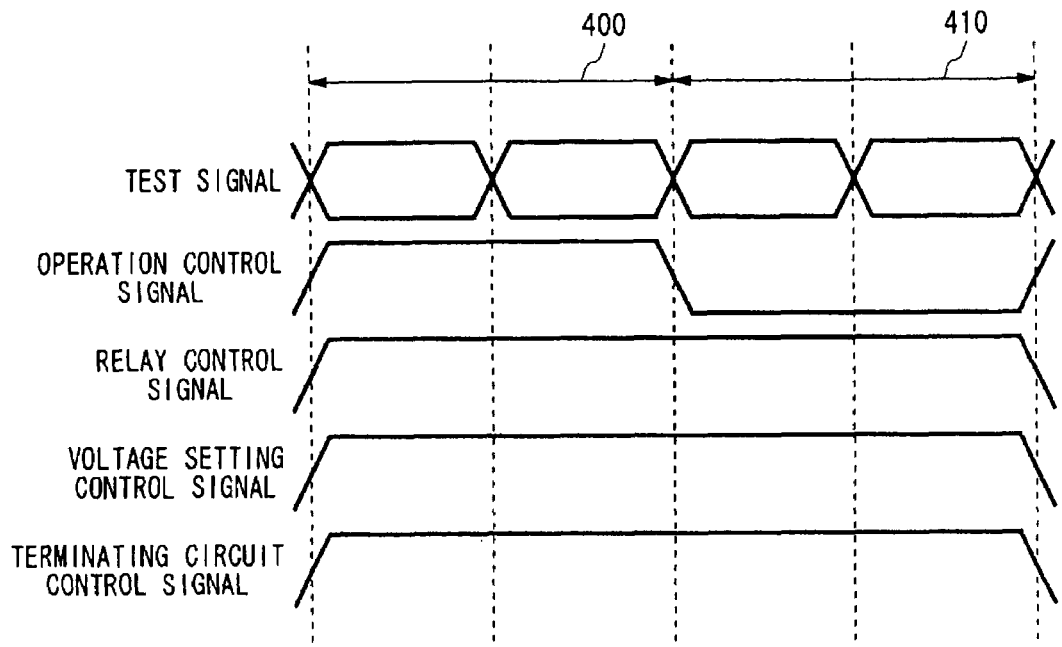
FIG. 5 shows an example of the waveforms of a test signal, an operation control signal, a relay control signal a voltage setting control signal and a terminating circuit control signal.

FIG. 5A shows an example of the waveforms of the signals when a voltage setting control signal is logic H, respectively. Firstly, an operation of the test apparatus 30 in an interval 400 will be described. The operation control signal is logic H in the interval 400. That is to say, the test apparatus 300 writes to the DUT 15 in the interval 400. The fourth AND circuit 354 performs an AND operation on logic L being the inverted value of the operation control signal and logic L being the inverted value of the relay control signal and outputs logic H being the inverted value of the result of the operation as an actuating signal of the first relay 120 to short-circuit the first relay 120. Additionally, the fourth AND circuit 354 outputs logic H being the inverted value of the result of the operation to the fifth AND circuit 364.

The first AND circuit 344 performs an AND operation on logic L being the inverted value of the operation control signal, logic L being the inverted value of the voltage setting control signal and login H of the relay control signal and outputs logic H being the inverted value of the result of the operation to the third AND circuit 312. The second AND circuit 346 performs an AND operation on logic L being the inverted value of the operation control signal, logic H of the voltage setting control signal and logic H of the relay control signal and outputs logic L being the result of the operation to the OR circuit 314. The third AND circuit 312 performs an AND operation on the test signal and logic H being the inverted value of the result of the operation outputted by the first AND circuit 344 and outputs the test signal as the result of the operation to the OR circuit 314. The OR circuit 314 performs an OR operation on the test signal as the result of the operation outputted by the third AND circuit 312 and logic L as the result of the operation outputted by the second AND circuit 346 and outputs the test signal as the result of the operation to the driver 122 through the first relay 120. The fifth AND circuit 364 performs an AND operation on the inverted value of logic H being the inverted value of the result of the operation outputted by the fourth AND circuit 354 and logic H of the terminating circuit control signal and outputs logic L as the result of the operation as an actuating signal of the second relay 124 to release the second relay 124. Thus, the test apparatus 30 short-circuits the first relay 120 and releases the second relay 124 to apply the test signal to the DUT 15 in the interval 400.

Next, an operation of the test apparatus 30 in an interval 410 will be described. An operation control signal is logic L in the interval 410. That is to say, the test apparatus 30 reads from the DUT 15 in the interval 410. The fourth AND circuit 354 performs an AND operation on logic H being the inverted value of the operation control signal and logic L being the inverted value of the relay signal and outputs logic H being the inverted value of the result of the operation as an actuating signal of the first relay 120 to short-circuit the first relay 120. Additionally, the fourth AND circuit 354 outputs logic H being the inverted value as the result of the operation to the fifth AND circuit 364.

The first AND circuit 344 performs an AND operation on logic H being the inverted value of the operation control signal, logic L being the inverted value of the voltage setting control signal and logic H of the relay control signal and outputs logic H being the inverted value of the result of the operation to the third AND circuit 312. The second AND circuit 346 performs an AND operation on logic H being the inverted value of the operation control signal, logic H of the voltage setting control signal and logic H of the relay control signal and outputs logic H as the result of the operation to the OR circuit 314. The third AND circuit 312 performs an AND operation on the test signal and logic H being the inverted value of the result of the operation outputted by the first AND circuit 344 and outputs the test signal as the result of the operation to the OR circuit 314. The OR circuit 314 performs an OR operation on the test signal being the result of the operation outputted by the third AND circuit 312 and logic H being the result of the operation outputted by the second AND circuit 346 and outputs logic H being the result of the operation to the driver 122 through the first relay 120. That is to say, the OR circuit 314 consistently outputs logic H being the value of the voltage setting control signal to the driver 122 regardless of the value of the test signal. The fifth AND circuit 364 performs an AND operation on the inverted value of logic H being the inverted value of the result of the operation outputted by the fourth AND circuit 354 and logic H of the terminating circuit control signal and outputs logic L being the result of the operation as an actuating signal of the second relay 124 to release the second relay 124. Thus, the test apparatus 30 outputs the signal which is consistently logic H to the driver 122, short-circuits the first relay 120 and releases the second relay 124 to terminate the transmission path of the result signal by using the driver 122.

Figure 5B:
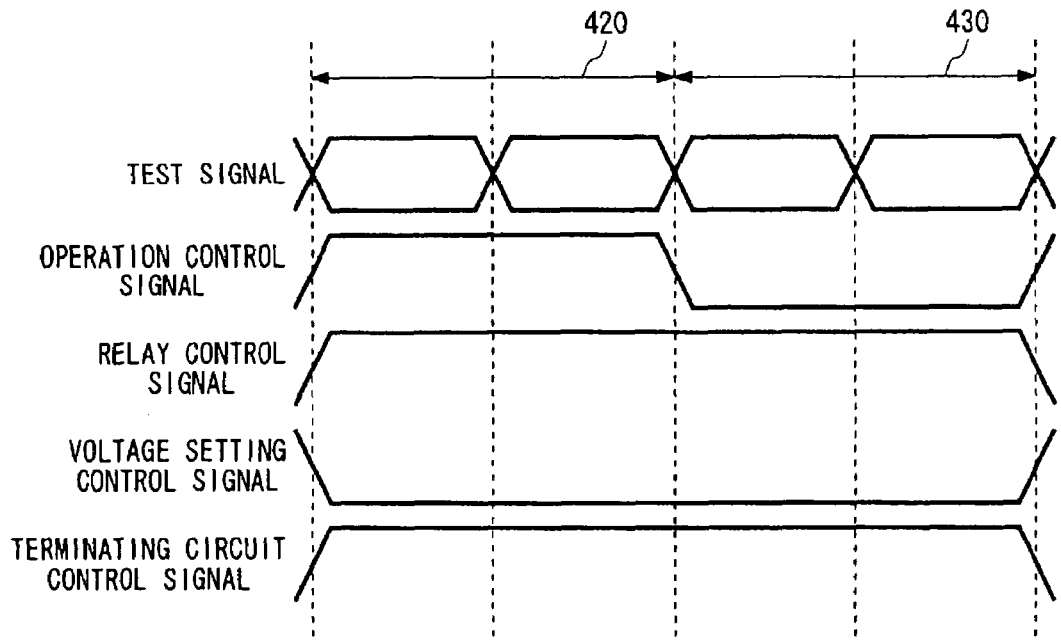

FIG. 5B shows an example of the waveforms of the signals when an voltage setting control signal is logic L, respectively. Firstly, an operation of the test apparatus 30 in an interval 420 will be described. The operation control signal is logic H in the interval 420. That is to say, the test apparatus 30 writes to the DUT 15 in the interval 420. The fourth AND circuit 354 performs an AND operation on logic L being the inverted value of the operation control signal and logic L being the inverted value of the relay control signal and outputs logic H being the inverted value of the result of the operation as an actuating signal of the first relay 120 to short-circuit the first relay 120. Additionally, the fourth AND circuit 354 outputs logic H being the inverted value as the result of the operation to the fifth AND circuit 364.

The first AND circuit 344 performs an AND operation on logic L being the inverted value of the operation control signal, logic H being the inverted value of the voltage setting control signal and logic H of the relay control signal and outputs logic H being the inverted value of the result of the operation to the third AND circuit 312. The second AND circuit 346 performs an AND operation on logic L being the inverted value of the operation control signal, logic L of the voltage setting control signal, and logic H of the relay control signal and outputs logic L being the result of the operation to the OR circuit 314. The third AND circuit 312 performs an AND operation on the test signal and logic H being the inverted value of the result of the operation outputted by the first AND circuit 344 and outputs the test signal being the result of the operation to the OR circuit 314. The OR circuit 314 performs an OR operation on the test signal being the result of the operation outputted by the third AND circuit and logic L being the result of the operation outputted by the second AND circuit 346 and outputs the test signal being the result of the operation to the driver 122 through the first relay 120. The fifth AND circuit 364 performs an AND operation on the inverted value of logic H being the inverted value of the result of the operation outputted by the fourth AND circuit 354 and logic H of the terminating circuit control signal and outputs logic L being the result of the operation as an actuating signal of the second relay 124 to release the second relay 124. Thus, the test apparatus 30 short-circuits the first relay 120 and releases the second relay 124 to apply the test signal to the DUT 15 in the interval 420.

Next, an operation of the test apparatus 30 in an interval 430 will be described. The operation control signal is logic L in the interval 430. That is to say, the test apparatus 30 reads from the DUT 15 in the interval 430. The fourth AND circuit 354 performs an AND operation on logic H being the inverted value of the operation control signal and logic L being the inverted value of the relay signal and outputs logic H being the inverted value as the result of the operation as an actuating signal of the first relay 120 to short-circuit the first relay 120. Additionally, the fourth AND circuit 354 outputs logic H being the inverted value as the result of the operation to the fifth AND circuit 364. The first AND circuit performs an AND operation on logic H being the inverted value of the voltage setting control signal and logic H of the relay control signal and outputs logic L being the inverted value as the result of the operation to the third AND circuit 312.

The second AND circuit 346 performs an AND operation on logic L being the inverted value of the operation control signal, logic L of the voltage setting control signal and logic H of the relay control signal and outputs logic L being the result of the operation to the OR circuit 314. The third AND circuit 312 performs an AND operation on the test signal and logic L being the inverted value of the result of the operation outputted by the first AND circuit 344 and outputs logic L being the result of the operation to the OR circuit 314. The OR circuit 314 performs an OR operation on logic L being the result of the operation outputted by the third AND circuit 312 and logic L being the result of the operation outputted by the second AND circuit 346 and outputs logic L being the result of the operation to the driver 122 through the first relay 120. That is to say, the OR circuit 314 consistently outputs logic L being the value of the voltage setting control signal to the driver 122 regardless of the value of the test signal. The fifth AND circuit 364 performs an AND operation on the inverted value of logic H being the inverted value of the result of the operation outputted by the fourth AND circuit 354 and logic H of the terminating circuit control signal and outputs logic L being the result of the operation as an actuating signal of the second relay 124 to release the second relay 124. Thus, the test apparatus 30, in the interval 430, outputs the signal which is consistently logic L to the driver 122, short-circuits the first relay 120 and releases the second relay 124 to terminate the transmission path of the result signal by using the driver 122.

Here, the configuration shown in the present embodiment is nothing more than an example, so various modifications can be added to the configuration. For example, the test apparatus 30 does not necessarily have the terminating circuit control section 160. In this case, the fourth AND circuit 354 performs an AND operation on the inverted value of the operation control signal generated by the operation control section 334 and the inverted value of the relay control signal generated by the relay control signal generating section 352, outputs the inverted value being the result of the operation as an actuating signal of the first relay 120 and also outputs the result of the operation as an actuating signal of the second relay 124. Thereby the fourth AND circuit 354 stops providing the test signal to the driver 122 and causes the terminating circuit 126 to terminate the transmission path of the result signal when the test apparatus 30 reads from the DUT 15 and the relay control signal is logic L.

Additionally, the test apparatus 30 does not necessarily have the first relay 120, the second relay 124, the terminating circuit 126, the relay control section 150 and terminating circuit control section 160. In this case, the operation control section 334 generates an operation control signal which is logic H when the test apparatus 30 writes to the DUT 15 and which is logic L when the test apparatus 30 reads from the DUT 15 and outputs the same to the voltage setting section 340. Then, the first AND circuit 344 performs an AND operation on the inverted value of the operation control signal generated by the operation control section 334 and the inverted value of the voltage setting control signal generated by the voltage setting control section 342 and outputs the inverted value of the result of the operation to the third AND circuit 312. Then, the second AND circuit 346 performs an AND operation on the inverted value of the operation control signal generated by the operation control section 334 and the voltage setting control signal generated by the voltage setting control section 342 and outputs the result of the operation to the OR circuit 314.

The test apparatus 30 according to the present embodiment can switchably set to logic H or logic L the voltage of the test signal provided to the driver 122 which terminates the transmission path of the result signal based on the voltage setting control signal when a writing operation of the test signal to the DUT 15 and a reading operation of the result signal from the DUT 15 are switched without a relay. Thereby a test method according to the characteristic of the DUT 15 can be appropriately selected, so that the test can be efficiently performed.

Figure 6:
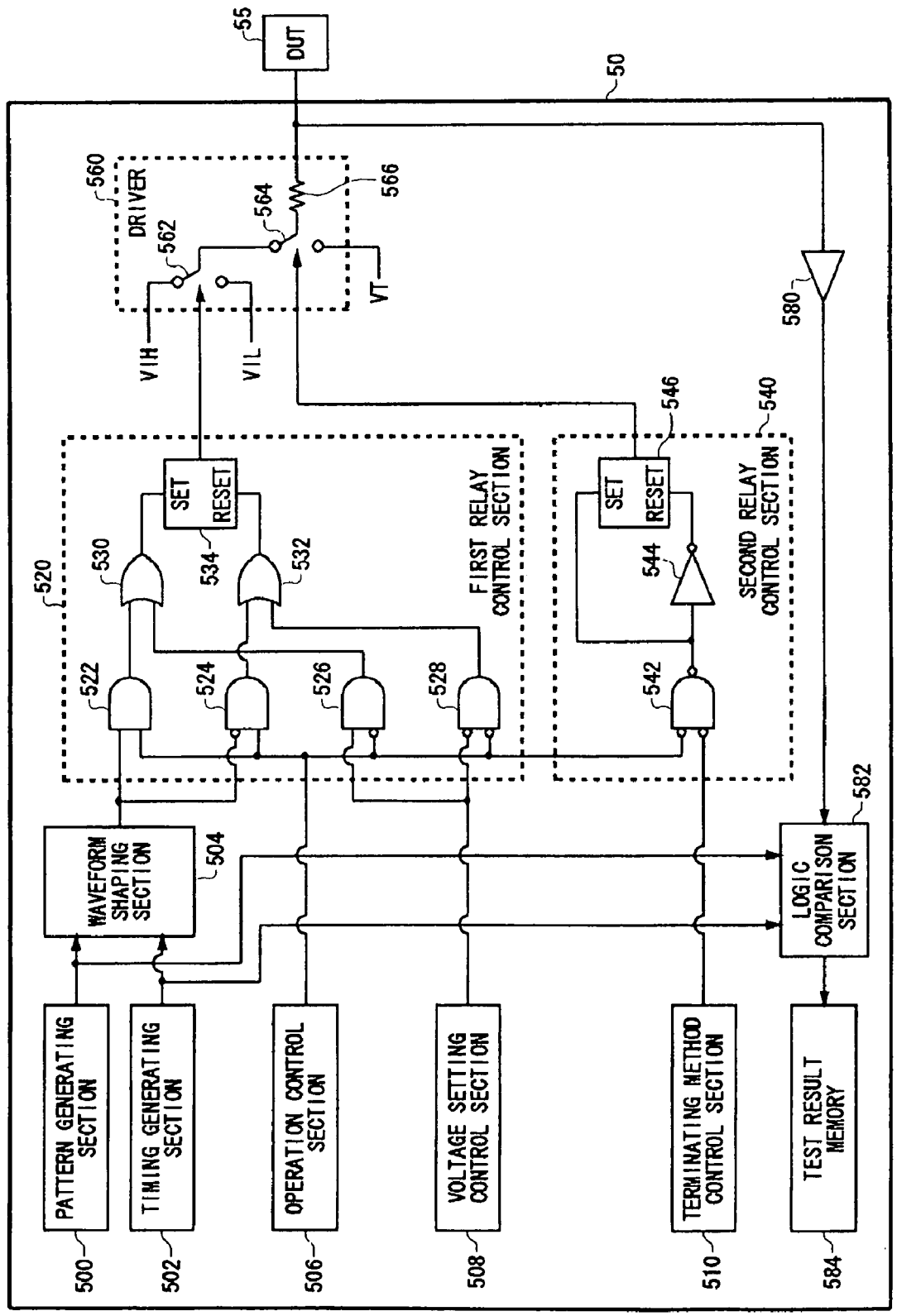
FIG. 6 is a block diagram showing an example of the configuration of a test apparatus 50 according to a third embodiment of the present invention.

FIG. 6 is a block diagram showing an example of the configuration of a test apparatus 50 according to a third embodiment of the present invention. The test apparatus 50 includes a pattern generating section 500, a timing generating section 502, an waveform shaping section 504, an operation control section 506, a voltage setting control section 508, a terminating method control section 510, a first relay control section 520, a second relay control section 540, a driver 560, a comparator 580, a logic comparison section 582 and a test result memory 584.

The test apparatus 50 applies a test signal to the DUT 15 by using the driver 560. Then, the test apparatus 50 compares the result signal outputted by the DUT 55 corresponding to the applied test signal with a reference voltage by using the comparator 580 and collates the comparison result with an expected value to determine pass/fail of the DUT 55. Here, reading the result signal from the DUT 55, the test apparatus 50 causes the driver 560 to terminate the transmission path of the result signal from the DUT to the comparator 580. The test apparatus 50 tests the DUT 55 being capable of terminating the transmission path of the result signal by either of high level voltage VIH or low level voltage VIL which is applied to the DUT 55. The object of the test apparatus 50 according to the present invention is to switchably control which of the voltage determined based on the test signal or the terminating voltage VT should be used to terminate the transmission path of the result signal by using the driver 560.

The pattern generating section 500 generates a test signal being a digital signal and outputs the same to the waveform shaping section 504. Additionally, the pattern generating section 500 generates an expected value and outputs the same to the logic comparison section 582. The timing generating section 502 generates a timing signal indicative of the timing at which the test signal is written to the DUT 55 and outputs the same to the waveform shaping section 504 and the logic comparison section 582. The waveform shaping section 504 outputs the test signal received from the pattern generating section 500 to the first relay control section 520 at the timing indicated by the timing signal received from the timing generating section 502.

The operation control section 506 generates an operation control signal which is logic H when the test apparatus 50 writes to the DUT 55 and which is logic L when the test apparatus 50 reads from the DUT 55 and outputs the same to the first relay control section 520 and the second relay control section 540. The voltage setting control section 508 generates a voltage setting control signal which indicates which of the high level voltage VIH or the low level voltage VIL is used to terminate the transmission path of the result signal based on the test signal, and outputs the same to the first relay control section 520. The terminating method control section 510 generates, during reading from the DUT, a terminating method control signal which is logic H when the transmission path of the result signal is terminated by using the voltage determined by the test signal and which is logic L when the transmission path of the result signal is terminated by using the terminating voltage VT, and outputs the same to the second relay control section 540.

The first relay control section 520 includes a first AND circuit 522, a second AND circuit 524, a third AND circuit 526, a fourth AND circuit 528, a first OR circuit 530, a second OR circuit 532 and a first latch circuit 534. The first AND circuit 422 performs an AND operation on the test signal received from the waveform shaping section 504 and the operation control signal received from the operation control section 506 and outputs the result of the operation to the first OR circuit 530. The second AND circuit 524 performs an AND operation on the inverted value of the test signal received from the waveform shaping section 504 and the inverted value of the operation control signal received from the operation control section 506 and outputs the result of the operation to the second OR circuit 532. The third AND circuit 526 performs an AND operation on the voltage setting control signal received from the voltage setting control section 508 and the inverted value of the operation control signal received from the operation control section 506 and outputs the result of the operation to the first OR circuit 530. The fourth AND circuit 528 performs an AND operation on the inverted value of the voltage setting control signal received from the voltage setting control section 508 and the inverted value of the operation control signal received from the operation control section 506 and outputs the result of the operation to the second OR circuit 532.

The first OR circuit 530 performs an OR operation on the result of the operation received from the first AND circuit 522 and the result of the operation received from the third AND circuit 526 and outputs the result of the operation to the first latch circuit 534. The second OR circuit 532 performs an OR operation on the result of the operation received from the second AND circuit 524 and the result of the operation received from the fourth AND circuit 528 and outputs the result of the operation to the first latch circuit 534. The first latch circuit 534 outputs to the driver 560 logic H when the result of the operation received from the first or circuit 530 is logic H, and outputs logic L when the result of the operation received from the second OR circuit 532 is logic H.

Thus, the first relay control section 520 outputs the logical value of the test signal to the driver 560 when the test apparatus 50 writes to the DUT 55, that is, the operation control signal is logic L. Meanwhile, the first relay control section 520 outputs the logical value of the voltage control signal to the driver 560 when the test apparatus 50 reads from the DUT 5, that is, the operation control signal is logic L.

The second control section 540 includes a fifth AND circuit 542, a NOT circuit 544 and a second latch circuit 546. The fifth AND circuit 542 performs an AND operation on the operation control signal received from the operation control section 506 and the terminating method control signal received from the terminating method control section 510 and outputs the result of the operation to the NOT circuit 544 and the second latch circuit 546. The NOT circuit 544 outputs the inverted value of the result of the operation received from the fifth AND circuit 542 to the second latch circuit 546. The second latch circuit 546 outputs to the driver 560 logic H when the result of the operation received from the fifth AND circuit 542 is logic H, and outputs logic L when the signal received from the NOT circuit 544 is logic H, that is, the result of the operation in the fifth AND circuit 542 is logic L. Thus, the second relay control section 540 outputs to the driver 560 logic H when the test apparatus 50 writes to the DUT 55 and outputs to the driver 560 the logical value of the terminating method control signal when the test apparatus 50 reads from the DUT 55.

The driver 560 terminates the transmission path of the result signal when the test apparatus applies the test signal to the DUT 15 and reads from the DUT 55. The driver 560 includes a first relay 562, a second relay 564, and a resistor 566. The first relay 562 outputs to the second relay 564 a high level voltage VIH when the signal received from the first relay control section 520 is logic H, and outputs to the second relay 564 a low level voltage VIL when the signal received from the first relay control section 520 is logic L. The second relay 564 applied either of the high level voltage VIH or the low level voltage VIL received from the first relay 562 when the signal received from the second relay control section 540 is logic L, and applies the terminating voltage VT when the signal received from the second relay control section 540 is logic L to the DUT 55 through the resistor 566 of 50 ohm.

As described above, in the test apparatus 50, the operation control section 506 generates the operation control signal being logic H to apply the high level voltage VIH or the low level voltage VIL to the DUT 55 dependent on the voltage of the test signal. Additionally, in the test apparatus 50, the operation control section 506 generates the operation control signal being logic L, and the terminating method control section 510 generates the terminating method control signal being logic H. Therefore, the driver 560 can terminate the transmission path of the result signal by using the high level voltage VIH when the voltage setting control signal is logic H, and by using the low level voltage VIL when the voltage setting control signal is logic L. Further, in the test apparatus 50, the operation control section 506 generates the operation control signal being logic L, and the terminating method control section 510 generates the terminating method control signal being logic L. Therefore, the driver 560 can terminate the transmission path of the result signal by using the terminating voltage VT.

The comparator 580 compares the result signal outputted by the DUT 55 with a predetermined reference voltage and outputs the comparison result to the logic comparison section 582. The logic comparison section 582 determines pass/fail of the DUT 55 based on the comparison result received from the comparator 580. Specifically, the logic comparison section 582 collates the comparison result received from the comparator 580 with the expected value received from the pattern generating section 500 at the timing based on the timing signal received from the timing generating section 502. Then, the logic comparison section 582 determines pass/fail of the DUT 55 based on whether the comparison result is matched with the expected value. Then, the logic comparison section 582 stores the result of pass/fail of the DUT 55 in the test result memory 584.

The test apparatus 50 according to the present embodiment can switchably control which of the high level voltage VIH or the low level voltage VIL is used to terminate the transmission path of the result signal by using the terminating method control signal.

While the present invention have been described with the embodiment, the technical scope of the invention not limited to the above described embodiment. It is apparent to persons skilled in the art that various alternations and improvements can be added to the above-described embodiment. It is apparent from the scope of the claims that the embodiment added such alternation or improvements can be included in the technical scope of the invention.

What is claimed is:

1. A test apparatus for testing a device under test, comprising:
    a driver for applying a test signal to the device under test;
    a comparator for comparing a result signal outputted by the device under test corresponding to the applied test signal with a predetermined reference voltage; and
    a setting voltage output section for setting the voltage of the test signal to a predetermined voltage value to cause the driver to terminate a transmission path of the result signal when the test apparatus reads from the device under test,
    further comprising:
    a first relay for switching whether the test apparatus is provided to the driver;
    a terminating circuit for terminating the transmission path of the result signal;
    a second relay for switching whether the transmission path of the result signal is terminated by the terminating circuit; and
    a relay control section for switchably control whether the first relay stops providing the test signal to the driver and the second relay causes the terminating circuit to terminate the transmission path of the result signal instead that the setting voltage output section causes the driver to terminate the transmission path of the result signal when the test apparatus reads from the device under test.

2. The test apparatus according to claim 1, wherein the test signal is a digital signal, and the test apparatus further including: a voltage setting section for switchably setting a predetermined setting voltage in the setting voltage output section to logic H or logic L.

3. The test apparatus according to claim 2 further comprising an operation control section for generating an operation control signal which is logic H during writing to the device under test and which is logic L during reading from the device under test,
    wherein the voltage setting section including: a voltage setting control section for generating a voltage setting control signal indicative of the predetermined setting voltage in the setting voltage output section; a first AND circuit for performing an AND operation on the inverted value of the operation control signal and the inverted value of the voltage setting control signal and outputting the inverted value of the result of the operation; and a second AND circuit for performing an AND operation on the inverted value of the operation control signal and the voltage setting control signal, and
    wherein the setting voltage output section including: a third AND circuit for performing an AND operation on the test signal and the inverted value of the result of the operation outputted by the first AND circuit; and an OR circuit for performing an OR operation on the result of the operation of the third AND circuit and the result of the operation of the second AND circuit and outputting the result of the operation to the driver to set the voltage value of the test signal to the value of the voltage setting control signal and cause the driver to terminate the transmission path of the result signal.

4. The test apparatus according to claim 1, wherein the test signal is a digital signal, the test apparatus further includes an operation control section for generating logic H during writing to the device under test and generating logic L during reading from the device under test, the setting voltage output section includes an AND circuit for performing an AND operation on the test signal and the operation control signal and outputting the result of the operation to the driver to set the voltage value of the test signal to logic L and cause the driver to terminate the transmission path of the result signal when the test apparatus reads from the device under test.

5. The test apparatus according to claim 1,
wherein the test signal is a digital signal,
the test apparatus further including:
an operation control section for generating an operation control signal which is logic H during writing to the device under test and which is logic L during reading from the device under test,
the relay control section including:
a relay control signal generating section for generating, during reading from the device under test, a relay control signal which is logic H when the setting voltage output section causes the driver to terminate the transmission path of the result signal and which is logic L when the first relay stops providing the test signal to the driver and the second relay causes the terminating circuit to terminate the transmission path of the signal;
a first AND circuit for performing an AND operation on the inverted value of the operation control signal and the relay control signal and outputting the inverted value of the result of the operation; and
a second AND circuit for performing an AND operation on the inverted value of the operation control signal and the inverted value of the relay control signal and outputting the inverted value of the result of the operation as an actuating signal of the first relay and also outputting the result of the operation as an actuating signal of the second relay to stop providing the test signal to the driver and cause the terminating circuit to terminate the transmission path of the result signal when the test apparatus reads from the device under test and the relay control signal is logic L, and wherein the setting voltage output section includes a third AND circuit for performing an AND operation on the test signal and the inverted value of the result of the operation outputted by the first AND circuit and outputting the result of the operation to the driver through the first relay to cause the driver to terminate the transmission path of the result signal when the test apparatus reads from the device under test and the relay control signal is logic H.

6. A test method for testing a device under test in a test apparatus including a driver for applying a test signal to the device under test and a comparator for comparing a result signal outputted by the device under test corresponding to the applied test signal with a predetermined reference voltage,
wherein the test apparatus further includes:
a first relay for switching whether the test apparatus is provided to the driver;
a terminating circuit for terminating a transmission path of the result signal;
a second relay for switching whether the transmission path of the result signal is terminated by the terminating circuit; and
a relay control section for switchably control whether the first relay stops providing the test signal to the driver and the second relay causes the terminating circuit to terminate the transmission path of the result signal instead,
the test method comprising: setting the voltage of the test signal to a predetermined voltage value to cause the driver to terminate the transmission path of the result signal when the test apparatus reads from the device under test.

* * * * *